(12) United States Patent
Shibuya (10) Patent No.: US 10,701,844 B2
(45) Date of Patent: Jun. 30, 2020

(54) MAGNETICALLY SHIELDED ROOM

(71) Applicant: TDK Corporation, Tokyo (JP)

(72) Inventor: Tomohiko Shibuya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/464,020

(22) PCT Filed: Nov. 27, 2017

(86) PCT No.: PCT/JP2017/042451
§ 371 (c)(1),
(2) Date: May 24, 2019

(87) PCT Pub. No.: WO2018/101216
PCT Pub. Date: Jun. 7, 2018

(65) Prior Publication Data
US 2019/0387647 A1  Dec. 19, 2019

(30) Foreign Application Priority Data
Dec. 2, 2016 (JP) .................................. 2016-235274

(51) Int. Cl.
*H05K 9/00* (2006.01)
*E04B 1/92* (2006.01)
*G01R 33/421* (2006.01)

(52) U.S. Cl.
CPC ............. *H05K 9/0001* (2013.01); *E04B 1/92* (2013.01); *G01R 33/421* (2013.01)

(58) Field of Classification Search
CPC ........................... H05K 9/0001; H05K 9/0003
See application file for complete search history.

(56) References Cited

U.S. PATENT DOCUMENTS

| | | | | |
|---|---|---|---|---|
| 2,793,245 A * | 5/1957 | Dunn | .................. | H05K 9/0001 174/373 |
| 4,806,703 A * | 2/1989 | Sims | .................. | H05K 9/0001 174/373 |
| 5,081,071 A * | 1/1992 | Hirschkoff | .......... | H05K 9/0001 257/E39.017 |
| 2008/0129068 A1* | 6/2008 | Brummel | ............... | A61G 3/001 296/24.38 |
| 2011/0222249 A1* | 9/2011 | Ruehl | .................. | H05K 7/1497 361/752 |

FOREIGN PATENT DOCUMENTS

| | | |
|---|---|---|
| JP | 3-233086 A | 10/1991 |
| JP | 4-59249 U | 5/1992 |
| JP | 2008-042128 A | 2/2008 |
| JP | 2009-224694 A | 10/2009 |
| JP | 2016-101264 A | 6/2016 |

OTHER PUBLICATIONS

International Search Report of International Application No. PCT/JP2017/042451, dated Feb. 27, 2018.

* cited by examiner

*Primary Examiner* — Hung V Ngo
(74) *Attorney, Agent, or Firm* — Leydig, Voit & Mayer, Ltd.

(57) ABSTRACT

A magnetically shielded room includes an upper shielding body, a side peripheral shielding body and a lower shielding body, all of which define a magnetically shielded inner space. The magnetically shielded inner space is divided into first and second inner spaces by a partition member which is a magnetic shielding body. A door, which is a magnetic shielding body, is provided for commonly closing the first and second inner spaces.

9 Claims, 6 Drawing Sheets

MAGNETICALLY SHIELDED ROOM

TECHNICAL FIELD

The present invention relates to a magnetic shield room which is used for various magnetic measurements.

BACKGROUND ART

In a conventional magnetic shield room, as shown in Patent Document 1 below, an inner space is surrounded by an upper member (may also be referred to as "ceiling member"), a side peripheral member (may also be referred to as "wall member") and a lower member (may also be referred to as "floor member") all of which are made of a material having high magnetic permeability, and the above inner space is shielded from an external environmental magnetic field to crease a low magnetic field therein. The magnetic shield room is also used for the measurement of a magnetocardiogram (Patent Document 2 below)

PRIOR ART DOCUMENTS

Patent Documents

[Patent Document 1]: Japanese Laid-Open Patent Publication No. 2008-42128
[Patent Document 2]: Japanese Laid-Open Patent Publication No. 2016-101264

SUMMARY OF THE INVENTION

Problem to be Solved by the Invention

As shown in Patent Document 2, conventionally, supplementary equipment such as a power unit for driving a magnetic sensor and a measurement circuit control unit have become noise sources themselves. For example, a magnetic field noise (such as a hum noise caused by a 50 Hz or 60 Hz commercial power source) is generated from cables connected to the power unit and the measurement circuit control unit. Therefore, the supplementary equipment are installed outside the magnetic shield room. When the magnetic shield room is carried and used, the work of installing the supplementary equipment outside the magnetic shield room is required each time, which is troublesome.

The present invention was made in view of this situation and it is an object of the present invention to provide a magnetic shield room having a space for installing supplementary equipment necessary for measurement in addition to a space for performing magnetic measurement.

Means for Solving Problem

An aspect of the present invention is a magnetic shield room. The magnetic shield room comprises:
an upper shield body, a side peripheral shield body and a lower shield body all of which form a magnetically shielded inner space, wherein
the inner space is divided into first and second inner spaces by a partition member which is a magnetic shield body.
In the aspect, the magnetic shield room may comprise a door which is a magnetic shield body provided in common to the first and second inner spaces, and
a lid which is a magnetic shield body for closing an opening on the door side of the second inner space and is detachable or openable.

In the aspect, the magnetic shield room may comprise first and second doors which are magnetic shield bodies provided for the first and second inner spaces, respectively, and can be opened and closed.

In the aspect, a through hole may be formed in either one of magnetic shield bodies which are the upper shield body, the side peripheral shield body, the lower shield body and the partition member, and a through conductor is provided on at least part of an inner wall of the through hole and is made conductive to a conductor plate of the magnetic shield body.

In the aspect, a pedestal having higher rigidity than the lower shield body may be provided on an under surface of the lower shield body, and moving means for moving over a floor is provided on a bottom surface of the pedestal.

The moving means may be moving means with a stopper.

The upper shield body, the side peripheral shield body, the lower shield body and the partition member may be made conductive to the pedestal.

It is to be noted that any arbitrary combination of the above-described structural components as well as the expressions according to the present invention changed among a system and so forth are all effective as and encompassed by the present aspects.

Effect of the Invention

According to the present invention, there can be provided a magnetic shield room having a space for installing supplementary equipment necessary for measurement in addition to a space for performing magnetic measurement.

EMBODIMENTS FOR CARRYING OUT THE INVENTION

Preferred embodiments of the present invention will now be described in detail with reference to the drawings. The same or equivalent constituent parts, members, etc., shown in the drawings are designated by the same reference numerals and will not be repeatedly described as appropriate. The embodiments are not intended to limit the invention but are mere exemplifications, and all features or combinations thereof described in the embodiments do not necessarily represent the intrinsic natures of the invention.

Figure 1:
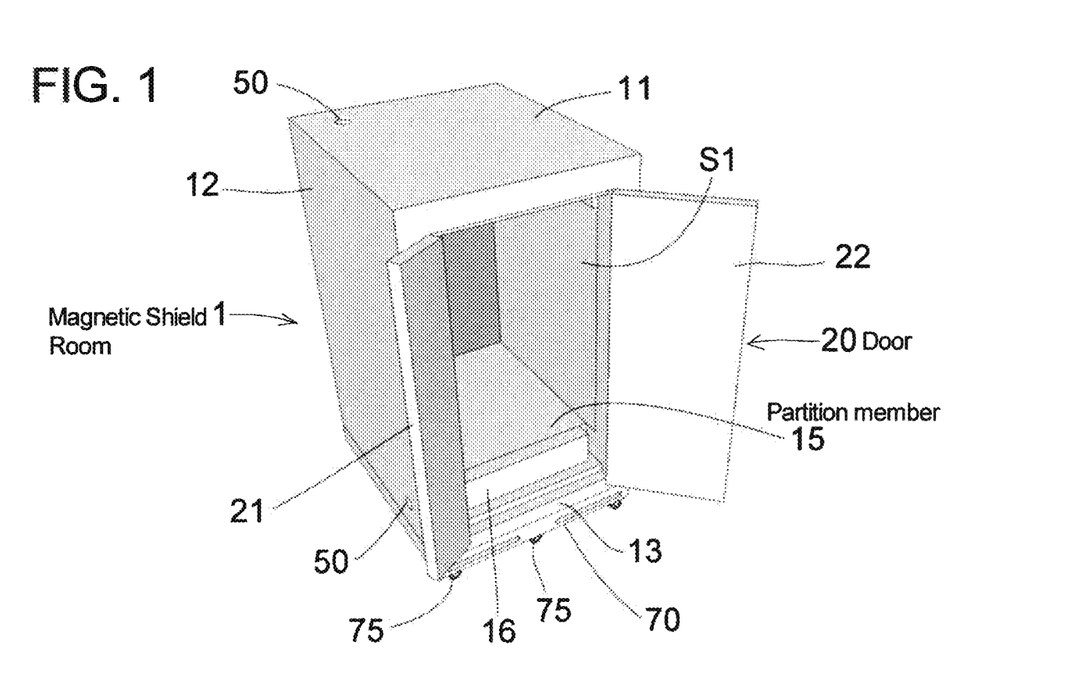
FIG. 1 is a perspective view seen from the front upper left direction of a first embodiment of a magnetic shield room according to the present invention.
Figure 2:
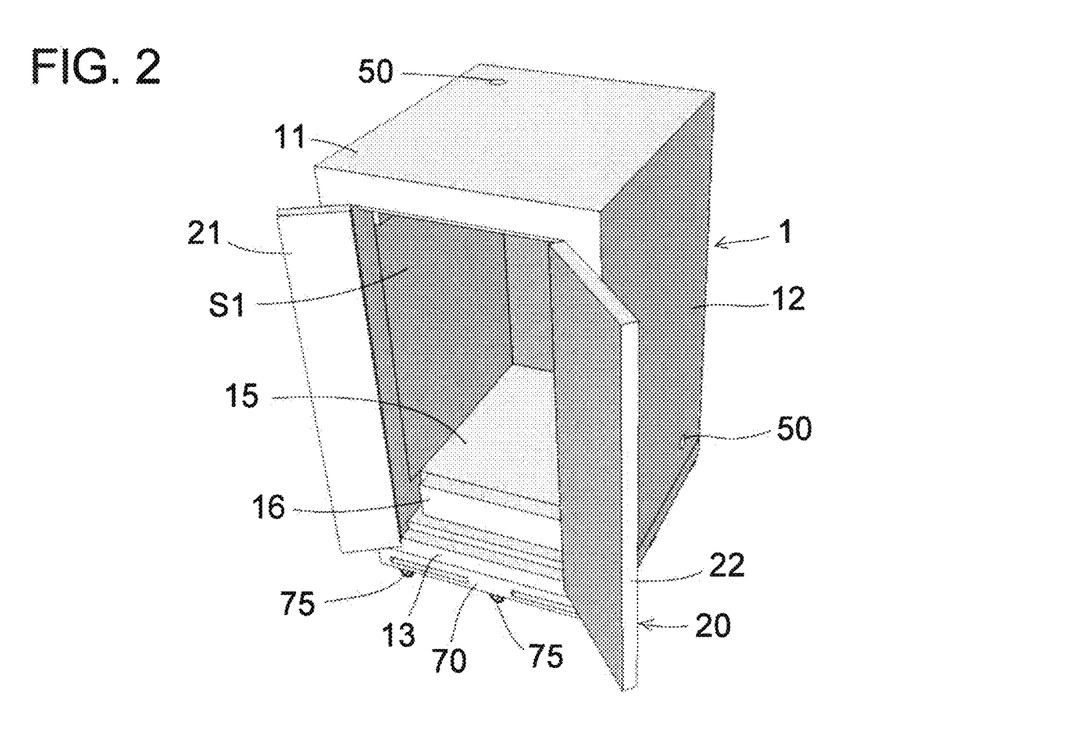
FIG. 2 is a perspective view seen from the front upper right direction of the first embodiment.
Figure 3:
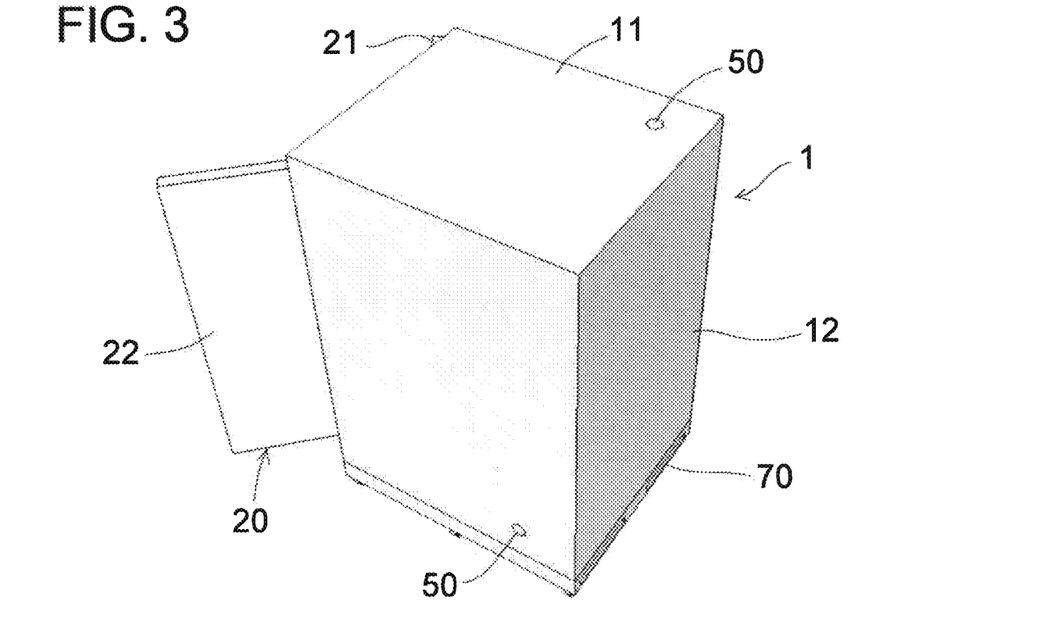
FIG. 3 is a perspective view seen from the rear upper left direction of the first embodiment.
Figure 4:
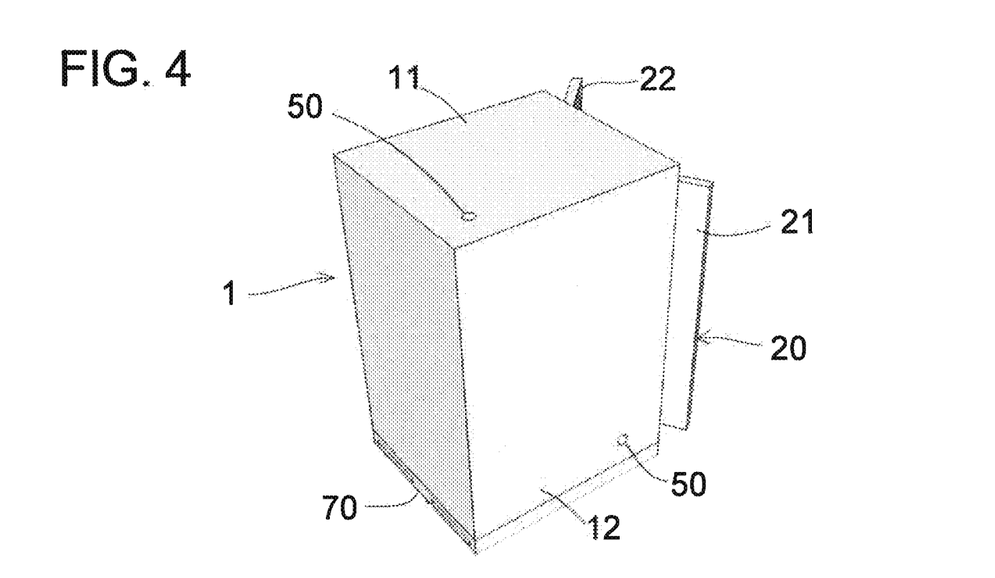
FIG. 4 is a perspective view seen from the rear upper right direction of the first embodiment.
Figure 5:
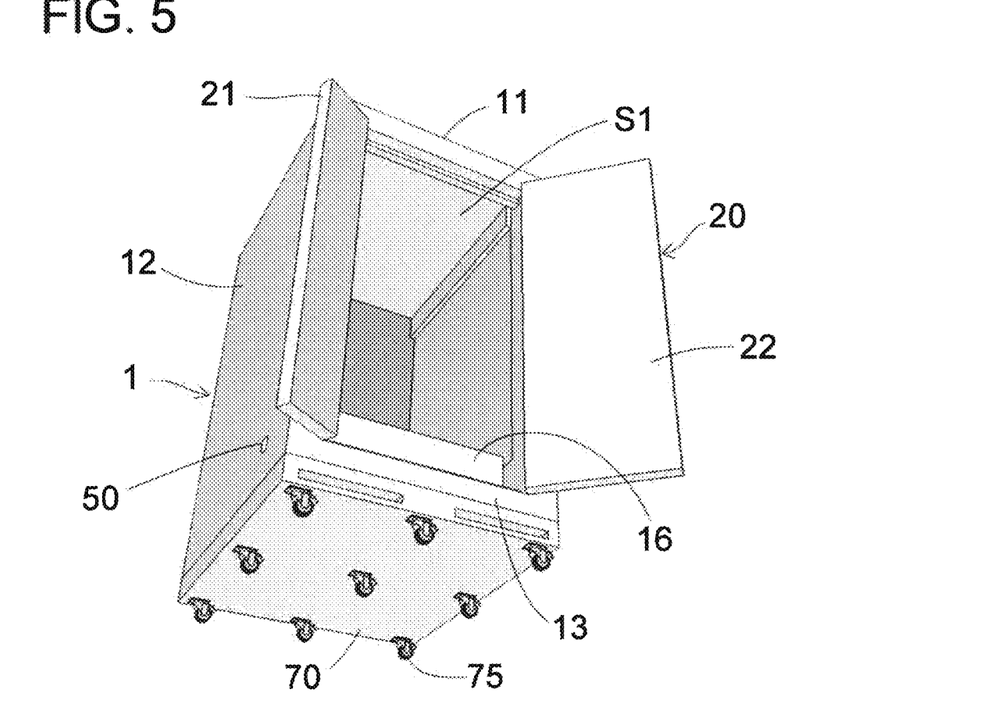
FIG. 5 is a perspective view seen from the bottom lower left direction of the first embodiment.
Figure 6:
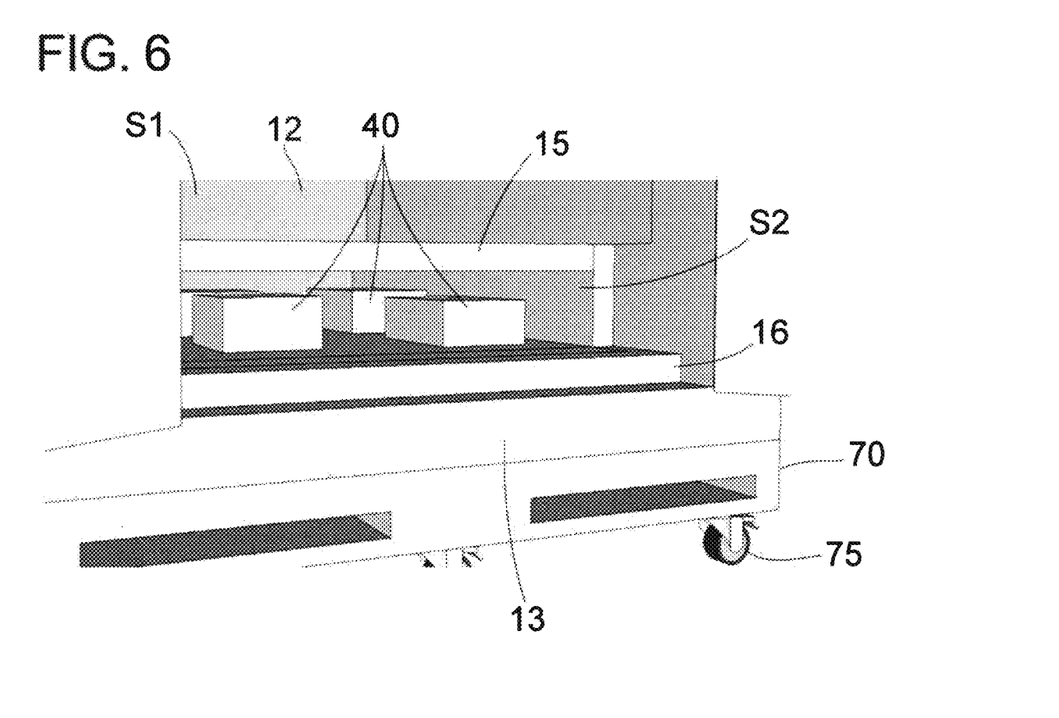
FIG. 6 is a partial perspective view seen from the front left direction of the arrangement of supplementary equipment in the first embodiment.
Figure 7:
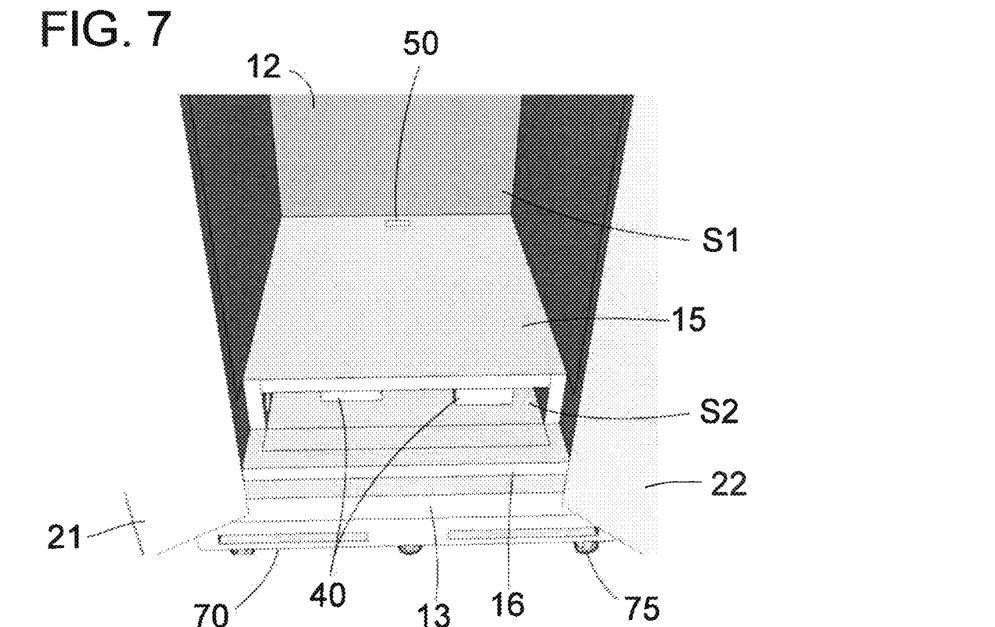
FIG. 7 is a partial perspective view seen from the front upper direction of the first embodiment.
Figure 8:
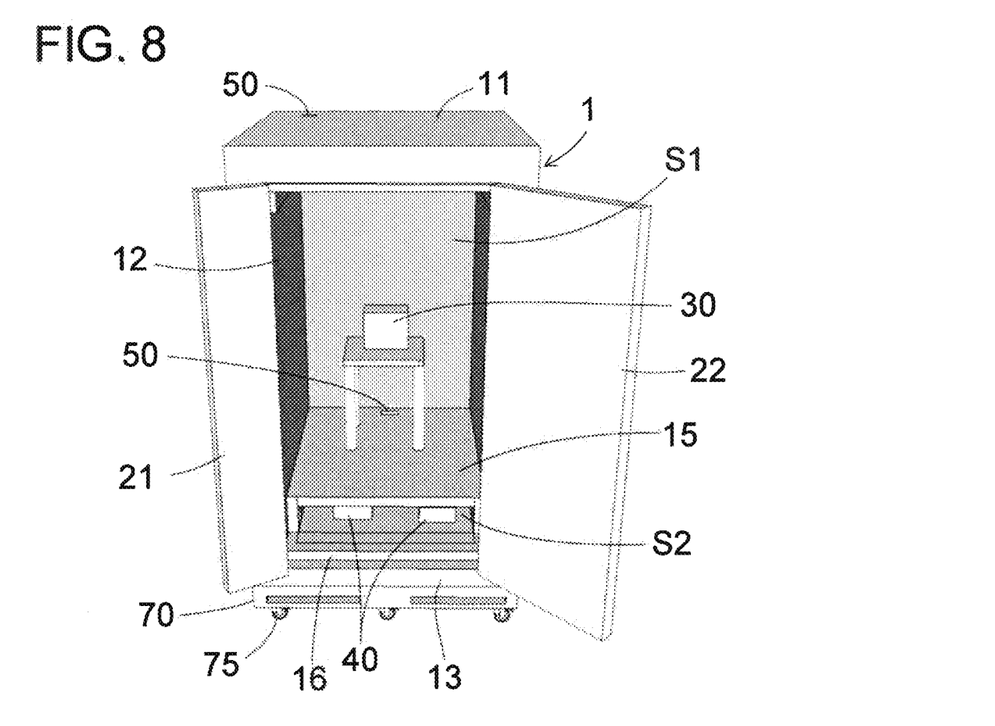
FIG. 8 is a perspective view seen from the front upper direction of the arrangement of an object to be measured and supplementary equipment in the first embodiment.

A first embodiment of the magnetic shield room according to the present invention will be described with reference to FIGS. 1 to 9. In these figures, the magnetic shield room 1 has an upper shield body 11, a side peripheral shield body 12, a lower shield body 13, a door 20 for opening and closing an opening in the side wall, a partition member 15 for dividing an inner space formed by these into first and second inner spaces S1 and S2 as shown in FIG. 7 and FIG. 8, and a lid 16 which closes an opening on the door side of the second inner space S2 and is detachable or can be opened and closed. The partition member 15 is substantially parallel to the lower shield body 13 and divides the above inner space into upper and lower spaces. The upper shield body 11, the side peripheral shield body 12, the lower shield body 13, the partition member 15, the lid 16 and the door 20 are magnetic shield bodies which can shield a magnetic field noise and an electromagnetic wave noise and have a laminated panel structure formed by sandwiching a nonmagnetic material (such as timber) between a permalloy plate as a magnetic material having high permeability and conductor and an aluminum plate as a conductor. The permalloy plate is effective in shielding a magnetic field noise and the aluminum plate is effective in shielding a high-frequency electromagnetic wave noise. A laminate structure formed by laminating together a plurality of permalloy plates and a plurality of aluminum plates is more preferred as the shielding rate is improved. It is preferred that the conductors of the magnetic shield bodies constituting the upper shield body 11, the side peripheral shield body 12, the lower shield body 13 and the partition member 15 should be electrically connected to one another. The door 20 is provided in common in the first and second inner spaces S1 and S2 and may be a single door but consists of a left door 21 and a right door 22 in this embodiment. They are connected to the right and left edge parts of the opening in the side peripheral shield body 12 by unshown hinges, respectively, in such a manner that they can open and close.

The first inner space S1 is a space surrounded by the upper shield body 11, the partition member 15, the side peripheral shield body 12 and the closed door 20 and has a larger capacity than the second inner space S2, an measurement object 30 is placed in this space as shown in FIG. 8, and also measurement equipment (not shown) such as a magnetic sensor for measuring the measurement object 30 is installed in this space. The second inner space S2 is a space surrounded by the lower shield body 13, the partition member 15, a lower part of the side peripheral shield body 12 and the closed lid 16 and has a smaller capacity than the first inner space S1, and supplementary equipment 40 such as a power unit and measurement control units are installed in this space as shown in FIG. 7 which shows the opened lid 16. The lid 16 is detachable or can be opened and closed to close the opening on the door 20 side of the second inner space S2.

Figure 10:
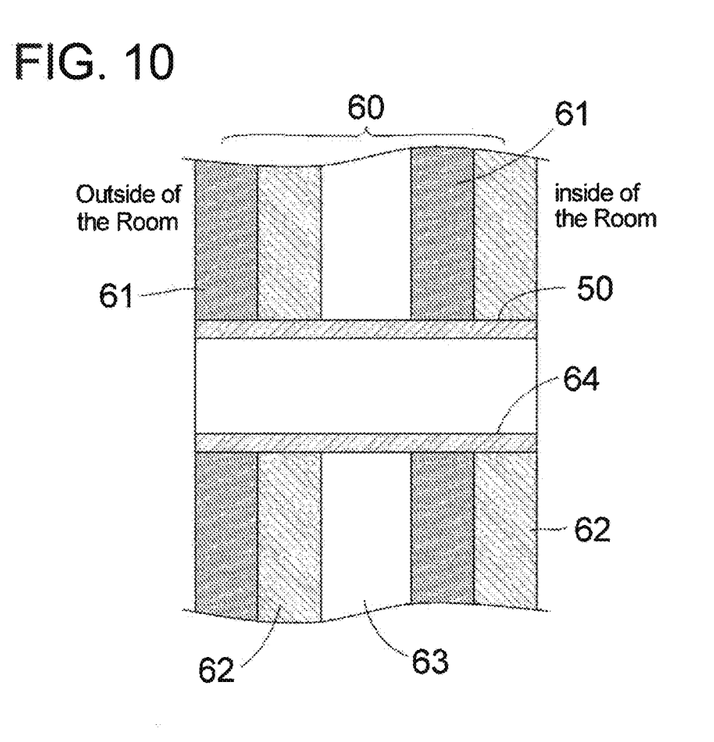
FIG. 10 is a sectional view of the structure of a through hole formed in the shield body of the first embodiment.

A through hole 50 for letting wirings connected to the magnetic sensor etc. for measuring the measurement object 30 in FIG. 8 and the power cords and cables of the supplementary equipment 40 such as the power unit and the measurement control units pass therethrough is formed in either one of the upper shield body 11, the side peripheral shield body 12, the lower shield body 13 and the partition member 15. As shown in FIG. 10, the upper shield body 11, the side peripheral shield body 12, the lower shield body 13 and the partition member 15 are laminated panels 60 manufactured by laminating together the permalloy plates 61, the aluminum plates 62 and the nonmagnetic material 63 such as timber, and a pipe-like through conductor 64 is provided on at least part of the inner wall of the through hole 50 penetrating the laminated panel 60. The permalloy plate 61 and the aluminum plate 62 on the inner side of the laminated panel 60 are made conductive to the permalloy plate 61 and the aluminum plate 62 on the outer side by the pipe-like through conductor 64 to have the same potential. The material of the pipe-like through conductor 64 is, for example, aluminum, copper or permalloy.

A pedestal 70 having the same size as the bottom surface of the lower shield body 13 and higher rigidity (for example, stainless steel) than the lower shield body 13 is provided on the bottom side (under surface) of the lower shield body 13 to mount and fix the lower shield body 13 thereon. At least three casters 75 with a stopper are attached to the bottom surface of the pedestal 70 as moving means for moving over the floor. The upper shield body 11, the side peripheral shield body 12, the lower shield body 13 and the partition member 15 are conductively connected to the pedestal 70 (electrically connected to have the same potential). The pedestal 70 may be made of a non-magnetic material having high rigidity and non-conductivity.

Figure 9:
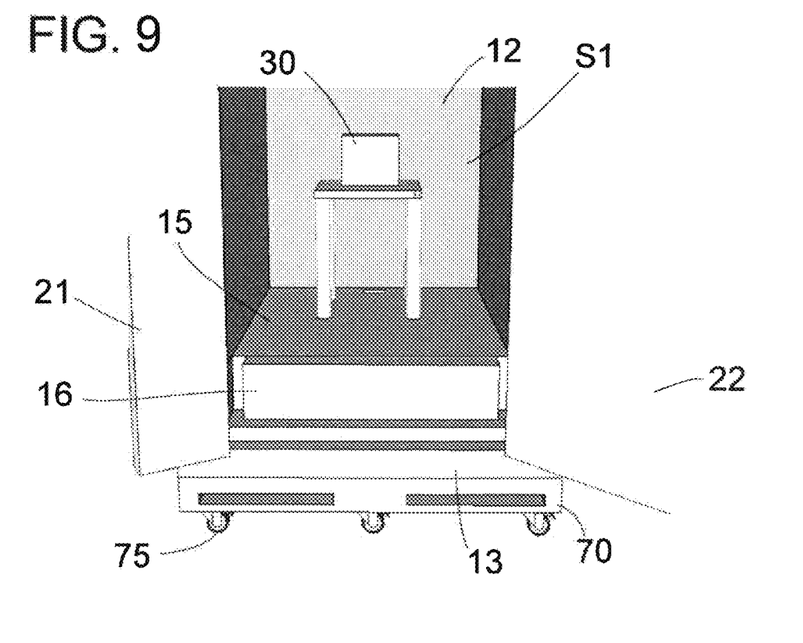
FIG. 9 is a partial perspective view seen from the front upper direction of a state that an opening in an inner space in which the supplementary equipment is arranged is shielded with a lid in the first embodiment.

A description is subsequently given of the method of using the magnetic shield room 1 with reference to FIGS. 6 to 9. As shown in FIG. 6 and FIG. 7, the supplementary equipment 40 such as the power unit and the measurement control units are installed in the second inner space S2 by opening the lid 16. The measurement equipment such as the magnetic sensor for measuring the measurement object 30 are installed in the first inner space S1. Thereafter, the measurement object 30 to be measured is placed in the first inner space S1, and the lid 16 is closed to close the opening on the door 20 side of the second inner space S2 as shown in FIG. 9. This prevents a magnetic field noise and an electromagnetic wave noise from leaking from the second inner space S2 to the first inner space S1 through a gap between the partition member 15 and the inner wall of the door. Then, the left door 21 and the right door 22 constituting the door 20 are closed. As a result, the first inner space S1 is magnetically shielded from the outside to prevent the intrusion of a magnetic field noise and an electromagnetic wave noise from the outside so that required magnetic measurement can be made on the measurement object 30.

According to this embodiment of the present invention, the following effects can be obtained.

(1) The magnetic shield room 1 has the upper shield body 11, the side peripheral shield body 12, the lower shield body 13 and the door 20 as a magnetic shield body all of which form a magnetically shielded inner space, and the inner space is divided into the first and second inner spaces S1 and S2 by the partition member 15 which is a magnetic shield body. Therefore, in addition to the first inner space S1 capable of performing magnetic measurement by shielding an external magnetic field noise and an external electromagnetic wave noise, the second inner space S2 for installing the supplementary equipment 40 necessary for measurement can be provided. The second inner space S2 also has the same noise shielding capability as that of the first inner space S1. Therefore, by installing the supplementary equipment 40 in the second inner space S2, when the magnetic shield room 1 is carried and used, the work of installing the supplementary equipment outside the magnetic shield room can be eliminated and the preparation of magnetic measurement using the magnetic shield room 1 can be made efficiently. An external magnetic field noise and an external electromagnetic wave noise can be shielded for the supplementary equipment 40 as well.

(2) When the door 20 is provided in common in the first and second inner spaces S1 and S2, the lid 16 which is a magnetic shield body for closing the opening on the door 20 side of the second inner space S2 is provided in such a manner that it is detachable or can be opened and closed. Therefore, when the lid 16 is closed, a magnetic field noise and an electromagnetic wave noise can be prevented from leaking from the second inner space S2 to the first inner space S1 through a gap between the partition member 15 and the inner wall of the door 20.

(3) Since one or a plurality of through holes 50 are formed in either one of the upper shield body 11, the side peripheral shield body 12, the lower shield body 13 and the partition member 15, wirings connected to the measurement equipment such as the magnetic sensor for measuring the measurement object 30 shown in FIG. 8 and the power cords and cables of the supplementary equipment 40 such as the power unit and the measurement control units can be let pass through the through hole(s) 50. The through conductor 64 is provided on at least part of the inner wall of the through hole 50 to be made conductive to the conducting plates (the permalloy plates 61 and the aluminum plates 62) of the shield bodies 11, 12, 13 or the partition member 15, thereby making it possible to reduce the leakage of an electromagnetic wave noise from the through hole 50.

(4) By mounting and fixing the body part of the magnetic shield room including the upper shield body 11, the side peripheral shield body 12 and the lower shield body 13 on the pedestal 70 having high rigidity, the weight of the bottom surface of the above body part is dispersed and stabilized, thereby making it possible to reduce the distortion of the magnetic shield room 1 at the time of moving.

(5) When the pedestal 70 is a conductor, grounding is easily made at the time of fixing the magnetic shield room 1 by electrically connecting the upper shield body 11, the side peripheral shield body 12 and the lower shield body 13 (that is, the body part of the magnetic shield room) to the pedestal 70. That is, the pedestal 70 should be connected to an external ground connection terminal.

Figures 11, 12:
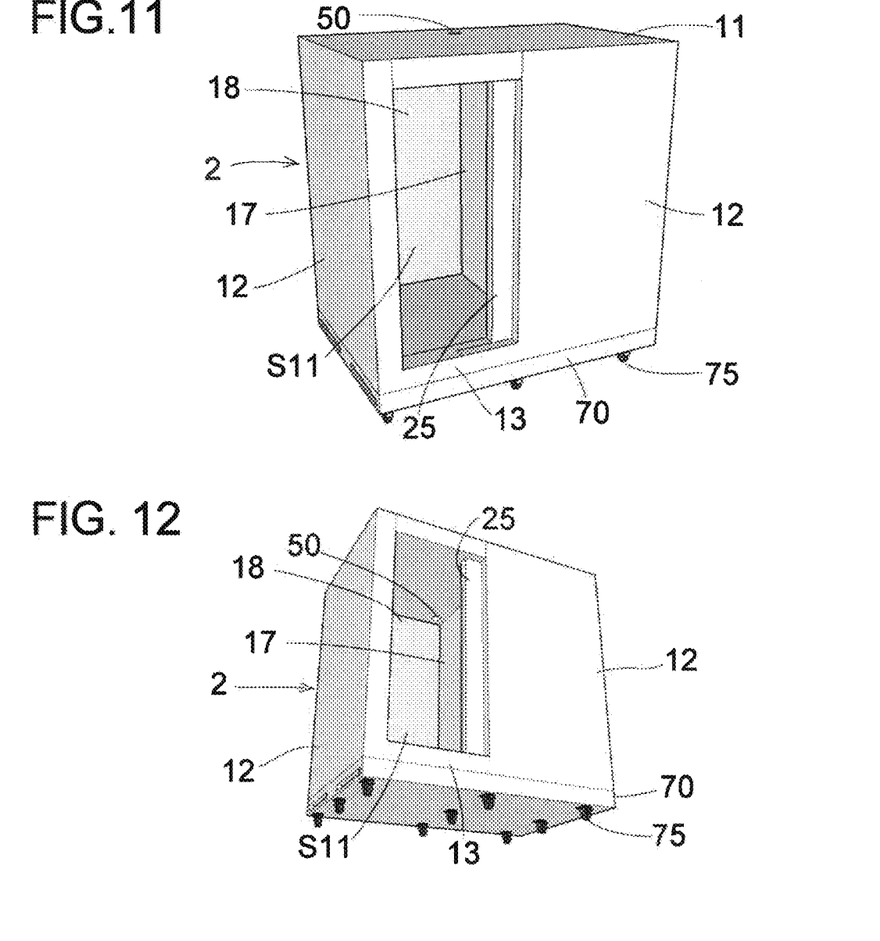
FIG. 11 is a perspective view seen from the front upper left direction of a second embodiment of the present invention.
FIG. 12 is a perspective view seen from the front lower left direction of the second embodiment.
Figure 13:
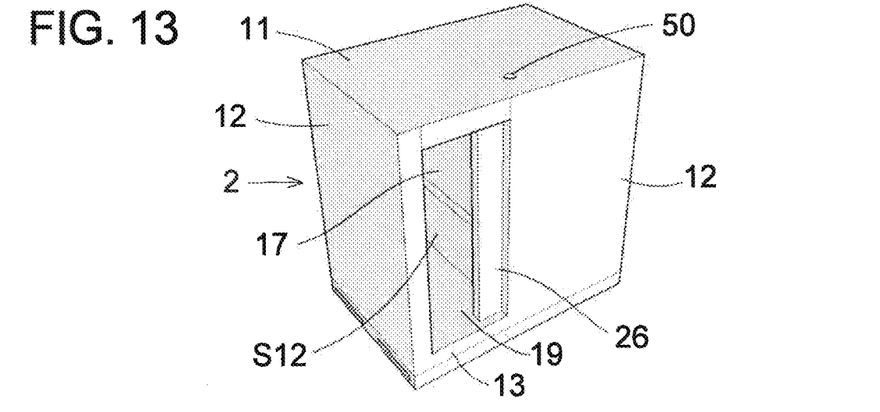
FIG. 13 is a perspective view seen from the rear upper left direction of the second embodiment.

A second embodiment of the magnetic shield room according to the present invention will be described with reference to FIGS. 11 to 13. In these figures, the magnetic shield room 2 has an upper shield body 11, a side peripheral shield body 12, a lower shield body 13, doors 25 and 26 for opening and closing openings 18 and 19 in the side wall formed on the front side and the rear side, respectively, and further a partition member 17 for dividing an inner space formed by these into first and second inner spaces S11 and S12. The partition member 17 is substantially parallel to the side peripheral shield body 12 and divides the above inner space into right and left spaces. The upper shield body 11, the side peripheral shield body 12, the lower shield body 13, the partition member 17 and the doors 25 and 26 are magnetic shield bodies which can shield a magnetic field noise and an electromagnetic wave noise and have a laminated panel structure formed by sandwiching a nonmagnetic material (such as timber) between a permalloy plate which is a magnetic material having high permeability and conductor and an aluminum plate which is a conductor (same as in the first embodiment). The door 25 closes the opening 18 in the side wall of the first inner space S11 and is a sliding door which opens and closes the opening 18 in the side wall located on the front side of the magnetic shield room 2. The door 26 closes the opening 19 in the side wall of the second inner space S12 and is a sliding door which opens and closes the opening 19 in the side wall on the rear side of the magnetic shield room 2. The doors 25 and 26 may be revolving doors in place of sliding doors.

The first inner space S11 is a space surrounded by the upper shield body 11, the side peripheral shield body 12, the lower shield body 13, the partition member 17 and the closed door 25. The second inner space S12 is a space surrounded by the upper shield body 11, the side peripheral shield body 12, the lower shield body 13, the partition member 17 and the closed door 26. For example, the object to be measured is placed in the first inner space S11 and the measurement equipment such as the magnetic sensor for measuring the object to be measured is arranged in the second inner space S12.

Like the first embodiment, a through hole 50 for letting wirings connected to the magnetic sensor etc. for measuring the measurement object 30 and the power cords and cables of the supplementary equipment such as the power unit and the measurement control units pass therethrough is formed in either one of the upper shield body 11, the side peripheral shield body 12, the lower shield body 13 and the partition member 17. As shown in FIG. 10, a pipe-like through conductor 64 is provided on the inner wall of the through hole 50.

Since the magnetic shield room of the second embodiment has the first and second inner spaces S11 and S12 on the right and left sides, the inner spaces S11 and S12 can be made large in height and therefore are suitable for storing a tall object to be measured and high supplementary equipment. Other constitution and function and effect of the second embodiment are the same as those of the first embodiment.

While the invention has been described in its preferred embodiments, it is to be understood by a person having ordinary skill in the art that variations may be made on each constituent element and process of the embodiments without departing from the scope of the following claims. Variations of the invention will be described hereinafter.

Although the appearance of the magnetic shield room is rectangular in the above embodiments of the present invention, it may be cylindrical. For example, it may have a structure that the inner space of a hollow cylinder is divided into upper and lower spaces or right and left spaces by a partition member. The inner space may be divided into three or more spaces by a plurality of partition members. Although the doors are provided on the front side and the rear side of the magnetic shield room in the second embodiment, respectively, if the openings of the divided inner space can be opened and closed individually, the arrangement of the doors is arbitrary. The doors in the above embodiments are not limited to revolving doors or sliding doors and may have any structure if they can open and close the openings of the inner space.

EXPLANATION OF NUMERALS 1, 2 magnetic shield room
11 upper shield body 12 side peripheral shield body
13 lower shield body
15, 17 partition member
16 lid
20, 25, 26 door
30 measurement object
40 supplementary equipment
50 through hole
60 laminated panel
70 pedestal
75 caster with a stopper
S1, S11 first inner space
S2, S12 second inner space

The invention claimed is:

1. A magnetically shielded room comprising:
an upper magnetically shielding body, a side peripheral magnetically shielding body, and a lower magnetically shielding body, all of which, together, define a magnetically shielded inner space;
a partition member, wherein the inner space is divided into first and second inner spaces by the partition member, which is a magnetically shielding body;
a pedestal having higher rigidity than the lower magnetically shielding body, wherein the pedestal is located on an under surface of the lower magnetically shielding body, wherein the upper magnetically shielding body, the side peripheral magnetically shielding body, the lower magnetically shielding body, and the partition member are electrically connected to the pedestal; and
moving means for moving over a floor located on a bottom surface of the pedestal.

2. The magnetically shielded room according to claim 1 including
a through hole in one of the upper magnetically shielding body, the side peripheral magnetically shielding body, the lower magnetically shielding body, and the partition member, and
a through conductor located on at least part of an inner wall of the through hole and electrically connected to a conductor plate of the magnetically shielding body that includes the through hole.

3. The magnetically shielded room according to claim 1, wherein the moving means includes a stopper.

4. A magnetically shielded room comprising:
an upper magnetically shielding body, a side peripheral magnetically shielding body, and a lower magnetically shielding body, all of which, together, define a magnetically shielded inner space;
a partition member, wherein the inner space is divided into first and second inner spaces by the partition member, which is a magnetically shielding body;
a door, which is a magnetically shielding body, commonly opening and closing the first and second inner spaces;
a lid, which is a magnetically shielding body, for closing an opening on a door side of the second inner space, and which is one of detachable and openable
a pedestal having higher rigidity than the lower magnetically shielding body, wherein
the pedestal is located on an under surface of the lower magnetically shielding body, and
the upper magnetically shielding body, the side peripheral magnetically shielding body, the lower magnetically shielding body, and the partition member are electrically connected to the pedestal; and
moving means for moving over a floor located on a bottom surface of the pedestal.

5. The magnetically shielded room according to claim 4 including
a through hole in one of the upper magnetically shielding body, the side peripheral magnetically shielding body, the lower magnetically shielding body, and the partition member, and
a through conductor located on at least part of an inner wall of the through hole and electrically connected to a conductor plate of the magnetically shielding body that includes the through hole.

6. The magnetically shielded room according to claim 4, wherein the moving means includes a stopper.

7. A magnetically shielded room comprising:
an upper magnetically shielding body, a side peripheral magnetically shielding body, and a lower magnetically shielding body, all of which, together, define a magnetically shielded inner space;
a partition member, wherein the inner space is divided into first and second inner spaces by the partition member, which is a magnetically shielding body;
first and second doors, which are magnetically shielding bodies, provided for the first and second inner spaces, respectively, and which can be opened and closed;
a pedestal having higher rigidity than the lower magnetically shielding body, wherein
the pedestal is located on an under surface of the lower magnetically shielding body, and
the upper magnetically shielding body, the side peripheral magnetically shielding body, the lower magnetically shielding body, and the partition member are electrically connected to the pedestal; and
moving means for moving over a floor located on a bottom surface of the pedestal.

8. The magnetically shielded room according to claim 7 including
a through hole in one of the upper magnetically shielding body, the side peripheral magnetically shielding body, the lower magnetically shielding body, and the partition member, and
a through conductor located on at least part of an inner wall of the through hole and electrically connected to a conductor plate of the magnetically shielding body that includes the through hole.

9. The magnetically shielded room according to claim 7, wherein the moving means includes a stopper.

* * * * *